United States Patent [19]
Tarrab et al.

[11] Patent Number: 6,097,889
[45] Date of Patent: Aug. 1, 2000

[54] SIGNAL PROCESSING APPARATUS WITH STAGES IN A SIGNAL PATH OPERATING AS LFSR OF ALTERNABLE TYPE AND METHOD FOR PROCESSING SIGNALS

[75] Inventors: Moshe Tarrab, Holon; Eytan Engel, Rosh-Haain; Eli Borowitz, Kiryat Ono; Leonid Belotserkovsky, Haifa, all of Israel

[73] Assignee: Motorola, Inc., Schaumburg, Ill.

[21] Appl. No.: 08/880,956

[22] Filed: Jun. 23, 1997

[51] Int. Cl.[7] ................................... G06F 15/00
[52] U.S. Cl. ................ 395/800.01; 377/72; 380/46
[58] Field of Search ............... 380/44, 46; 381/71.1; 377/72

[56] References Cited

U.S. PATENT DOCUMENTS

| | | | |
|---|---|---|---|
| 4,225,957 | 9/1980 | Doty, Jr. | 371/15 |
| 4,680,539 | 7/1987 | Tsai | 324/73 |
| 5,073,909 | 12/1991 | Kotzin et al. | 377/72 |
| 5,247,525 | 9/1993 | Taira et al. | 371/22.4 |
| 5,369,648 | 11/1994 | Nelson | 371/27.2 |
| 5,394,405 | 2/1995 | Savir | 371/27.2 |
| 5,446,683 | 8/1995 | Mullen et al. | 364/717.07 |
| 5,506,520 | 4/1996 | Frank | 326/96 |
| 5,589,787 | 12/1996 | Odinot | 327/202 |
| 5,642,362 | 6/1997 | Savir | 371/22.3 |

FOREIGN PATENT DOCUMENTS

| 1248030 | 7/1986 | Russian Federation | H03K 3/84 |
|---|---|---|---|

OTHER PUBLICATIONS

Bernard Sklar The Aerospace Corporation, El Segundo, California and University of California, Los Angeles "Digital Communications Fundamentals and Applications", Prentice Hall Englewood Cliffs, New Jersey 07632, pp. 292–293.

*Primary Examiner*—Albert De Cady
*Assistant Examiner*—Kenneth W Duff
*Attorney, Agent, or Firm*—Mathas Zahn; Keith E. Witek

[57] ABSTRACT

According to the present invention, an LFSR (300) has a propagation path (30) of serially coupled stages (65) and gates (80-3, 80-4), a feedforward path (10) of gates (80-1) and a feedback path (20) of gates (80-2). Depending on control signals (P, B, M), the gates (80-1, 80-2, 80-3, 80-4) are either active gates and operate as xor-gates or passive gates and operate as transfer gates. Feedforward and feedback signals are derived from input and output signals and can be supplied to any stage (65), so that characteristic polynomials of the input-output function are variable. The LFSR can fully or partly operate as a TYPE 1 or TYPE 2 LFSR which enables the execution of different algorithms on one hardware base.

12 Claims, 6 Drawing Sheets

6,097,889

SIGNAL PROCESSING APPARATUS WITH STAGES IN A SIGNAL PATH OPERATING AS LFSR OF ALTERNABLE TYPE AND METHOD FOR PROCESSING SIGNALS

FIELD OF THE INVENTION

This invention relates to electronic devices, and especially to a linear feedback shift register (LFSR) as a device for processing codes and to a method used therein.

BACKGROUND OF THE INVENTION

Linear Feedback Shift Registers (LFSR) are used in digital communication and other systems for data processing such as, for example, ciphering, error detecting, error correcting, or for generating pseudo random sequences. In an LFSR, a plurality of stages is coupled for sequential propagation of signals through the stages. The signal propagation can be influenced by exclusive-or-gates (xor-gates) arranged according to characteristic polynomials of an input-output function.

The theoretical background for using LFSRs in, e.g., a message encoder, is explained in chapter 5.6. of Sklar, B.: Digital Communications, Fundamentals and Applications, Prentice Hall, Englewood Cliffs, N.J., ISBN 0-13-211939-0 [1].

LFSRs can be classified into TYPE 1 and TYPE 2. This classification has been explained U.S. Pat. No. 5,073,909 to Kotzin et. al. [2] in reference to LFSR which are used to generate random sequences. LFSRs which read input signal IN and provide output signal OUT are now explained by way of example in FIGS. 1–2. FIG. 1 shows prior art LFSR 100 of TYPE 1. LFSR 100 comprises stages 111, 112, 113, 114 and xor-gates 115 and 116. IN is supplied to xor-gate 115 and then propagated through stages 111–114. OUT is available at the output of stage 114. Signal T1, obtained from xor-gate 116 acting upon the outputs of stages 113 and 114. T1 is then fed back to the input of stage 111 through xor-gate 15. TYPE 1, as used herein, defines an LFSR wherein the various stages (e.g., 111–114) are cascaded together, input to output, without interruption by an intervening signal (e.g., T1). TYPE 1 LFSRs are commonly used to implement algorithms for, e.g., the generation of a mask set sequence for data ciphering.

FIG. 2 shows prior art LFSR 200 of TYPE 2. LFSR 200 comprises stages 221, 222, 223, 224, and xor-gates 225 and 226. IN is supplied to xor-gate 225 and then propagated through stage 221, xor-gate 226, and stages 222–224. OUT is available at the output of stage 224. Xor-gate 226 performs an exclusive-or operation on the outputs of stages 221 and 224. This operation is then used to determine the state of stage 222.

Finally, the output of stage 224 is fed back to xor-gate 225. TYPE 2, as used herein, defines an LFSR wherein the various stages (e.g., 221–224) are cascaded together, however, the shift path is interrupted by the introduction of a signal (e.g., T2). TYPE 2 LFSRs are commonly used to implement algorithms for e.g., for parity code generation, error detection and error correction.

As is used herein and only for the convenience of explanation, a first direction is defined for signals going from elements (stages or xor-gates) with low reference numbers (e.g., 111) to elements with higher reference numbers (e.g., 114). A second direction is defined in the opposite way. As shown in the figures, the first direction goes from left to right and the second direction goes from right to left.

For example, in FIG. 1, IN goes in first direction to OUT, T1 goes in second direction from xor-gate 116 to xor-gate 115. T1 can therefore be considered as feedback signal. Although the term LFSR implies feeding "back" signals (e.g., T1, T2 of FIGS. 1–2), LFSRs as discussed here can also feed forward signals.

In LFSRs 100 and 200 as shown in FIGS. 1–2, the stages and xor-gates are hard wired so that the characteristic polynomials of the LFSR can not be changed. However, there are instances in circuit design where one application (e.g., a cellular phone) needs variable characteristic polynomials. Operators for phone systems may use their own proprietary polynomials for e.g., data ciphering. It is easier to market phones having similar hardware but different software than market phones having different hardware. Further, some applications require different data processing algorithms at different times. In view of hardware expenses and power consumption, it is not convenient to have separate LFSRs (TYPEs 1 and 2) for different algorithms. There is a need to design a LFSR able to provide both TYPE 1 and TYPE 2 features.

FIG. 4 of U.S. Pat. No. 5,446,683 to Mullen et. al. [1] shows an LFSR incorporating provisions for variation of the characteristic polynomial. However, the LFSR is of TYPE 1 and cannot be reconfigured to TYPE 2. The present invention seeks to provide a fully programmable LFSR with variable characteristic polynomials which is switchable between TYPE 1 and TYPE 2.

DETAILED DESCRIPTION OF A PREFERRED EMBODIMENT

Figure 1:
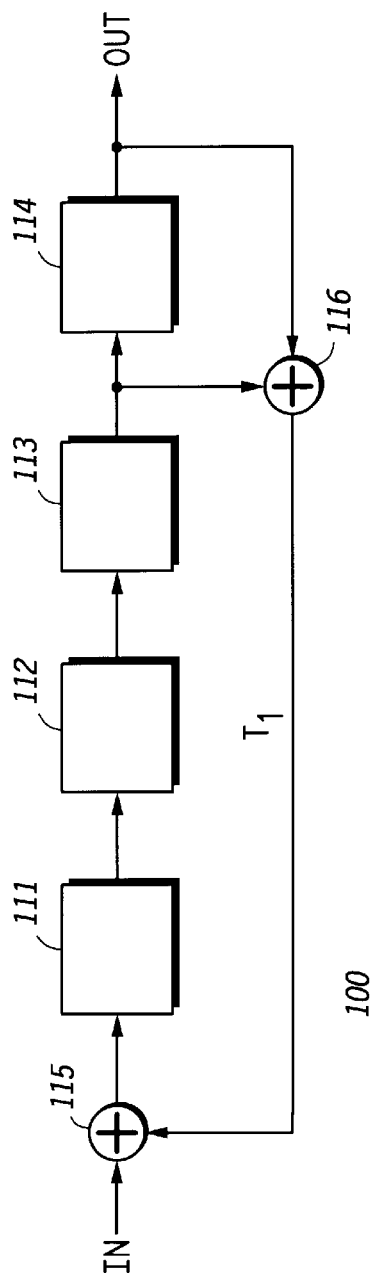
FIG. 1 shows a simplified block diagram of a prior art linear feedback shift register (LFSR) of TYPE 1.
Figure 6:
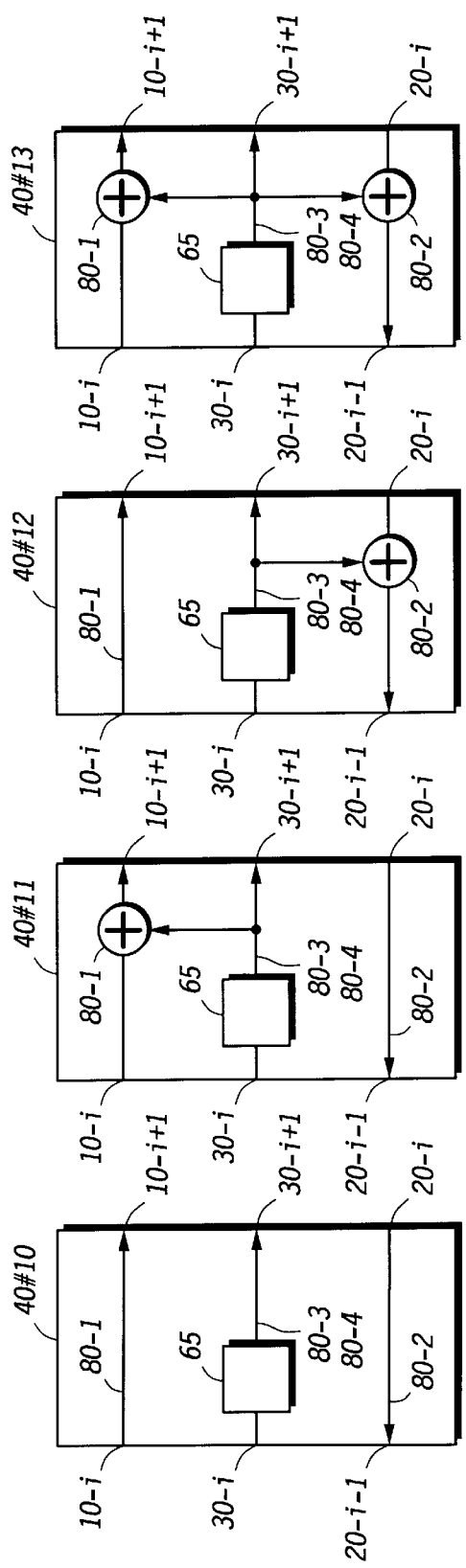
FIG. 6 shows simplified block diagrams of cells of FIG. 4 configured for operating the LFSR of FIG. 3 in a TYPE-1-MODE.
Figure 7:
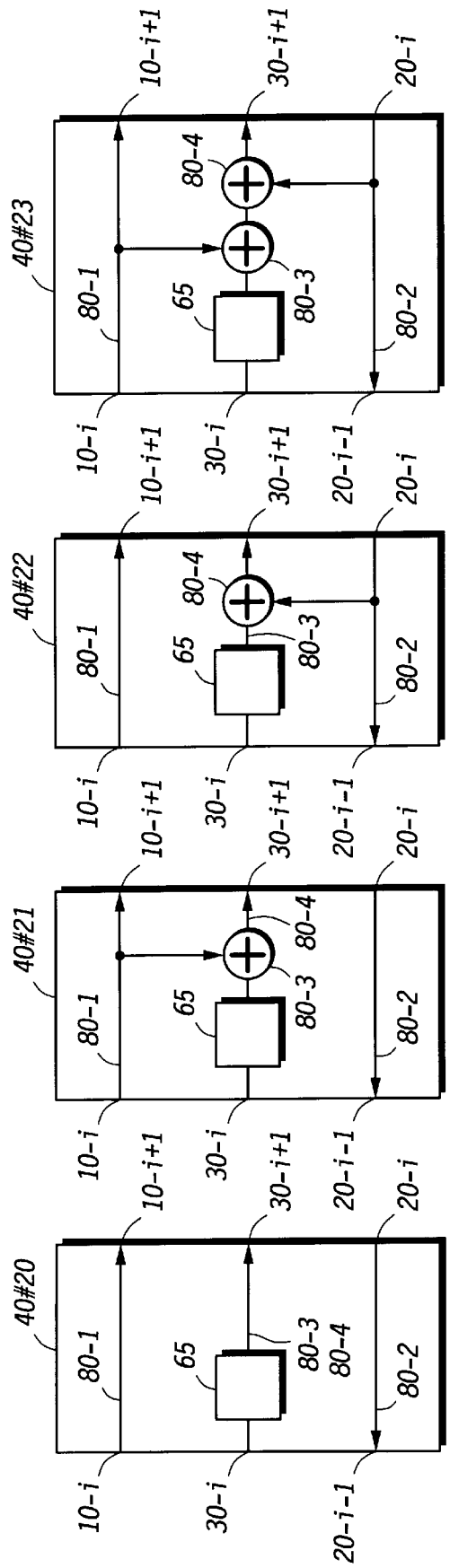
FIG. 7 shows simplified block diagrams of cells of FIG. 4 configured for operating the LFSR of FIG. 3 in a TYPE-2-MODE.
Figure 8:
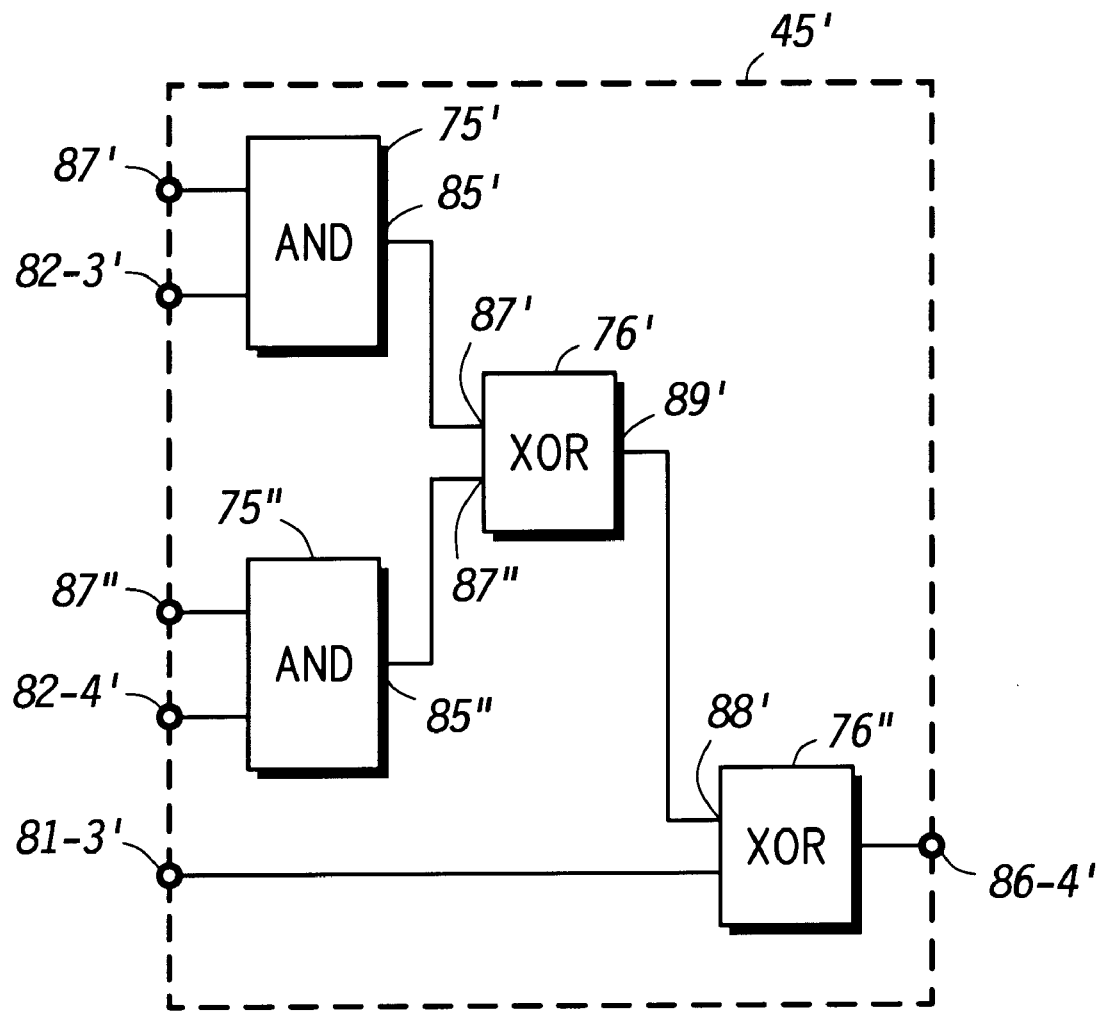
FIG. 8 shows a logic arrangement as it can also be used in cell 40.

The LFSR according to a preferred embodiment of the invention is illustrated by way of example in FIGS. 3–8. At first, the elements (e.g., cells, stages, gates) of the LFSR and their connections are explained in a top down view, from FIGS. 3 to 5. Second, the function of the LFSR is explained in a bottom up view, by FIGS. 5 to 3 and FIGS. 6–7. Third, it will be explained, how the LFSR can operate as LFSRs of FIGS. 1–2. FIG. 8 shows additional details.

For explanation and not intended to be limiting, signals are considered as binary signals having first and second logical states abbreviated as logical "1" and "0", respectively. In the text, signals are abbreviated by uppercase letters and acronyms (e.g., A, C, F, L, R, S, C, Y, R, PB, PF).

Figure 4:
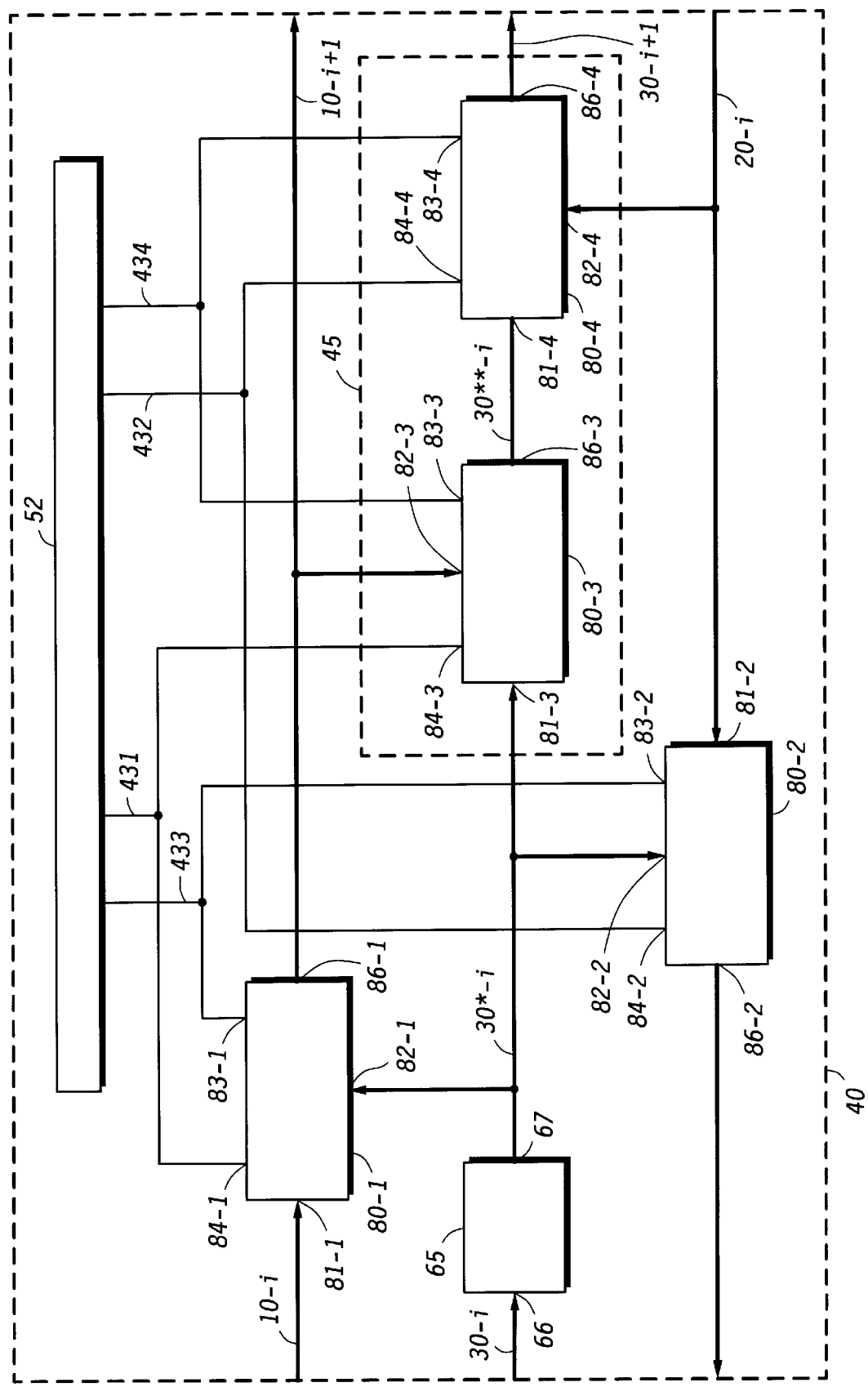
FIG. 4 shows a simplified block diagram of a cell as used in the LFSR of FIG. 3.

Logical functions known in the art are given in lowercase bold italics (e.g., xor, and). The elements have arabic reference numbers (e.g., 40). Some elements (e.g., cells) and signals (e.g., of signal vectors) are, preferably, available in pluralities. A single element or signal is referenced by an index, wherein elements and signals of a plurality are collectively referred without index. For elements, indices are attached to the numbers by a hyphen (e.g., 40-i, 40-2). For signals, indices are written as subscripts (e.g., $P_i$, $PB_2$). Unless otherwise stated, index i can have any value between 1 and n. For convenience of explanation, a preferred embodiment of the present invention is illustrated in FIG. 4 wherein k=4, but other values are possible for other implementations. There is no need to have all elements or signals with all possible values of i or k. Optionally, elements and signals can be left out. Indices can include sums or differences (e.g., i−1, i+1). For simplicity, connections for carrying clock signals to the elements are not shown. Persons of skill in the art will understand how to provide clock signals.

Figure 3:
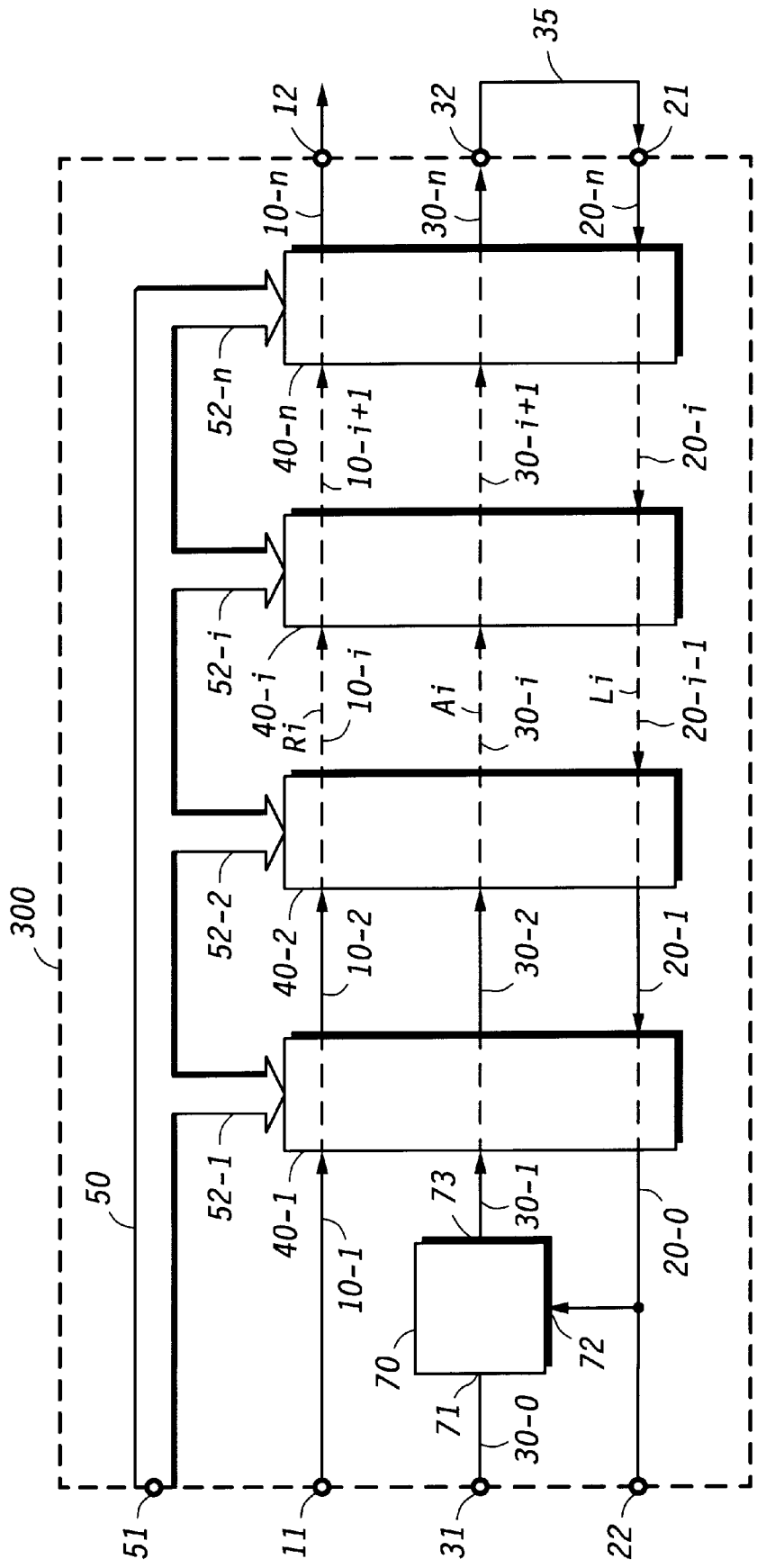
FIG. 3 shows a simplified block diagram of an LFSR in a preferred embodiment of the present invention.

FIG. 3 shows a simplified block diagram of linear feedback shift register 300 (dashed frame, hereinafter LFSR 300) in a preferred embodiment of the present invention. LFSR 300 comprises a plurality of cells 40, and optional xor-gate 70. For simplicity, in FIG. 3, only cells 40-1, 40-1, 40-i and 40-n are shown. Bus 50 at terminal 51 provides control signals to cells 40 at connections 52-1 to 52-n. Dashed connections in cells 40 illustrate a signal transfer through cells 40. As it will be explained in connection with FIGS. 4–5, cells 40 have gates which can be enabled or disabled by the control signals from bus 50 so that the signal transfer can be modified. Xor-gate 70 has inputs 71 and 72 and output 73 for relating signals by a xor-operation known in the art. Connections 30-i (i=0 to n+1) through xor-gate 70 and cells 40, preferably, couple, terminals 31 and 32. Connections 30 form thereby a propagation path for propagating data signals $A_i$, (i=0 to n+1). Connections 10-i (i=1 to n=m+1) through cells 40, preferably, couple terminals 11 and 12 and form a feedforward path with data signals $R_i$ (i=1 to n). Connections 20-i (i=n down to 0) through cells 40, preferably, couple terminals 21 and 22 and form a feedback path with data signals $L_i$ (i=n down to 0). Arrows on connections 10, 20, 30 here and in other figures show the preferred direction of signal flow. The terms 'forward' and 'back' are convenient abbreviations for the above mentioned first direction (e.g., increasing i) and second direction (e.g., decreasing i), respectively, that is, for referring to opposed directions of signal propagation through the LFSR.

Having the paths implemented by connections 10, 20, 30 going over the full range of indices i, is convenient for explanation, but not necessary for the invention. Connections 10, 20, and 30 can be shorter, so that for example, terminals 11, and 12 can be coupled to connections 10-2 and 10-5, respectively. It will be explained later, how cells 40 couple connection 30 to connections 10 and 20. As shown in FIG. 3 only for convenience and not intended to be limiting, it is assumed that connection 20 is coupled to input 72 and that connection 30 is coupled to connection 20 via connection 35 going through terminals 32 and 21.

Preferably, LFSR 300 receives, e.g., $A_0$ as input signal and sequentially propagates it in the first direction to e.g., $A_{n+1}$ as an output signal. Thereby, feedforward and feedback signals (e.g., $R_i$, $L_i$) go through cells 40 in the first (increasing i) and second (decreasing i) directions. Output signals (e.g., $R_m$, $L_1$, and $A_{n+1}$) can be obtained at any of connections 10, 20, or 30 having any index i. The input signal is related to the output signal by an input-output function which has variable characteristic polynomials. The input-output function is determined by a plurality of control signals in bus 50. Control signals can be e.g., polynom signals $PB_i$, $PF_i$ (collectively P), mode signals M1, M2 (collectively M), where "F" and "B" in combination with "P" refer to forward and backward propagation directions. Polynom signals form a first polynom vector (PF with e.g., $PF_1$ to $PF_m$) and a second polynom vector (PB with e.g., $PB_1$ to $PB_m$). Sequences of LFSR 300 or the complete LFSR 300 can be switched between a TYPE-1-MODE and a TYPE-2-MODE by selectively activating and de-activating the gates in the propagation path.

FIG. 4 shows a simplified block diagram of cell 40 (dashed frame) as used in LFSR 300. Connections 10, 20 and 30 and connections 52 correspond in FIGS. 3–4. Cell 40 comprises stage 65 and gates 80-1, 80-2, 80-3, and 80-4. Stage 65 is a storage means for receiving a signal at input 66 and propagating it to output 67. Stage 65 can be implemented by, for example, a D-type flip-flop known in the art. Preferably, each gate 80 has inputs 81, 82, 83, 84 and output 86. Gate 80 is described further in connection with FIG. 5.

In the propagation path, connection 30-i is coupled to input 66. Output 67 is coupled to inputs 82-1, 82-2 and 81-3 forming connection 30*-i. Output 86-3 is coupled to input 81-4 forming connection 30**-i and output 86-4 is coupled to connection 30-(i+1). In the feedforward path, connection 10-i is coupled to input 81-1, and output 86-1 leading into connection 10-(i+1) is coupled to input 82-3. In the feedback path, connection 20-i is coupled to input 81-2 and to input 82-4. Output 86-2 leads to connection 20-(i−1). Connections 431, 432, 433 and 434 originate from connection 52 and carry control signals. Connection 431 is coupled to input 84-1 and to input 84-3. Connection 432 is coupled to input 84-2 and to input 84-4. Connection 433 is coupled to input 83-1 and to input 83-2. Connection 434 is coupled to input 83-3 and to input 83-4. As far as a logical xor-operation is commutative, gates 80-3 and 80-4 can be arranged in a different order. Gate 80-3 and 80-4 form logic arrangement 45 (dashed frame).

Figure 5:
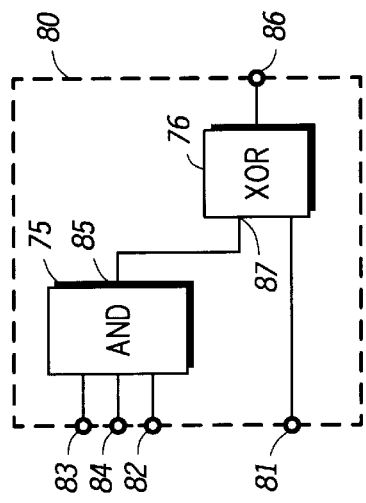
FIG. 5 shows a simplified block diagram of a gate as used in the cell of FIG. 4.

FIG. 5 shows a simplified block diagram of gate 80 (dashed frame) as used in cell 40 of FIG. 4. Reference numbers 81, 82, 83, 84 and 86 in FIG. 5 correspond to these of FIG. 4. Gate 80 comprises and-gate 75 and xor-gate 76. Xor-gate 76 has first data input 81. Xor-gate 76 has input 87 coupled to output 85 of and-gate 75. And-gate 75 has first control input 83, second control input 84, and second data input 82.

Gate 80 receives control signal M at input 83 and control signal P at input 84. Gate 80 receives first data signal F at input 81 and second data signal S at input 82. Gate 80 relates these signals to third data signal Y according to a logical function Y=f (M, P, S, F), as for example:

$$Y = (M \text{ and } P \text{ and } S) \text{ xor } F. \quad (1)$$

with 'xor' standing for a logical exclusive disjunctive operation and 'and' for a logical conjunctive operation. Gate 80 is in an active state ("active gate", "enabled gate") for (M and P)="1" and in a passive state ("passive gate", "disabled gate") for (M and P)="0". For convenience of explanation, control signals M and P can be combined to control signal C which is defined as:

$$C = M \text{ and } P. \quad (2)$$

Function (1) can be simplified to:

$$Y = (C \text{ and } S) \text{ xor } F. \quad (3)$$

For active gate 80, equation (1) becomes:

Y=("1" and S) xor F.

Y=S xor F. (4)

For passive gate 80, equation (1) becomes:

Y=("0" and S) xor F

Y=F. (5)

Table 1 is a truth table for gate 80 showing the logical relation of control signals M, and P at inputs 83, 84 (columns 1–2), and data signals F and S at inputs 81, 82 (columns 3–4) to data signal Y at output 86 (column 5). The term "any" stands for either logical "1" or "0" states of the signals. Configurations for active gates 80 are shown in rows 1–4, when both M and P are at logical "1". Active gate 80 operates as a xor-gate (Y xor F). Configurations for passive gate 80 are shown in rows 5–8 when either M or P or both are at logical "0". Passive gate 80 behaves like a conductor (e.g., a transfer gate) transferring F to Y without changing the logical state and without influence from S. Having active and passive states, gate 80 can be considered as a conditional xor-gate.

TABLE 1

Operation of gate 80

| | 1 | 2 | 3 | 4 | 5 |
|---|---|---|---|---|---|
| | control signals | | data signals | | |
| | M | P | F | S | Y |
| 1 | "1" | "1" | "0" | "0" | "0" |
| 2 | "1" | "1" | "0" | "1" | "1" |
| 3 | "1" | "1" | "1" | "0" | "1" |
| 4 | "1" | "1" | "1" | "1" | "0" |
| 5 | 0 | any | "1" | any | "1" |
| 6 | | | "0" | | "0" |
| 7 | any | 0 | "1" | any | "1" |
| 8 | | | "0" | | "0" |

In cell 40 (FIG. 4), control signal M1 at connection 433 is supplied to inputs 83-1 and 83-2 and M2 at connection 434 is supplied to inputs 83-3 and 83-4. Control signal $PF_i$ at connection 431 is supplied to inputs 84-1 and 84-3. Control signal $PB_i$ at connection 432 is supplied to inputs 84-2 and 84-4. In the propagation path, delay stage 65 receives $A_i$ at connection 30-i and provides $A_i^*$ after a delay to connection **30\*-i**. Signal $A_i^*$ is also expressed as $A_i/z$, with the term "1/z" indicating a delay as known in connection with z-transformations. Gate 80-3 receives $A_i^*$ at input 81-3 and $R_{i+1}$ at input 82-3 and provides $A_i^{**}=f(M2, PF_i, R_{i+}, A_i^*)$ at output 86-3 to connection **30\*\*-i. Gate 80-4 receives $A_i^{}$ at input 81-4 and $L_i$ at input 82-4 and provides $A_{i+1}=f(M2, PB_i, L_i, A_i^{})$ at output 86-4 to connection 30-(i+1). In the feedforward path, gate 80-1 receives $R_i$ at input 81-1 from connection 10-i** and $A_i^*$ at input 82-1 and provides data signal $R_{i+1}=f(M1, PF_i, A_i^*, R_i)$ at output 86-1 to connection 10-(i+1) according to equation (1). In the feedback path, gate 80-2 receives $L_i$ at input 81-2 from connection 20-i and $A_i^*$ at input 82-2 and provides $L_{i-1}=f(M1, PB_i, A_i^*, L_i)$ at output 86-2 to connection 20-(i-1) according to equation (1).

First it is assumed that cell 40 receives M1="1" and M2="0". Thereby, gates 80-3 and 80-4 pass data signals without changing them so that $A_{i+1}=A_i^*=A_i^{}=A_i$ (equation (5)). $R_{i+1}$ and $L_i$ have no influence. For explanation, the connections going to inputs 82-3 and 82-4 can therefore be considered as being non-existing. For $PF_i$="1", gate 80-1** provides $R_{i+1}=A_i^*$ xor $R_i$ (active gate, equation (4)). For $PF_i$="0", gate 80-1 provides $R_{i+1}=R_i$ (5). Depending on $PB_i$, gate 80-2 provides $L_{i-1}=A_i^*$ xor $L_i$ (4) or provides $L_{i-1}=L_i$. With this configuration, cell 40 is suitable to operate in a TYPE 1 LFSR.

Second it is assumed that cell 40 receives M1="0" and M2="1". Thereby, gates 80-1 and 80-2 pass data signals without changing them so that $R_{i+1}=R_i$ and $L_{i-1}=L_i$ (equation (5)). $A_i^*$ has no influence to inputs 82-1 and 82-2 and connections going to that inputs can be neglected. For $PF_i$="1", gate 80-3 provides $A_i^{**}=R_{i+1}$ xor $A_i^*$ (active gate, equation (4)). For $PF_i$="0", gate 80-3 passes $A_i^*$: $A_i^{**}=A_i^*$ (5). For $PB_i$="1", gate 80-4 provides $A_i=L_i$ xor $A_i^{}$ (4). For $PB_i$="0", gate 80-4 passes $A_i^{}$: $A_{i+1}=A_i^{}$ (5). For $PF_i=PB_i$="1", $A_i^{}$ can be substituted and $A_{i+1}$ calculated as $A_{i+1}=L_i$ xor $(R_{i+1}$ xor $A_i^*)$. Considering the linearity of the logical xor-operation, $A_{i+1}$ can also be expressed as $A_{i+1}=A_i^*$ xor $(L_i$ xor $R_{i+1})$.

In cells 40 as shown in the example of FIG. 4, a signal from the propagation path (i.e., $A_i^*$ at connections **30\*-i) is supplied to the forward path (connections 10) by a second inputs 82 of gate 80-1. The signal is supplied to the feedback path (connections 20) by second input 82 of gate 80-2. Inside the propagation path (connections 30), signals are transmitted through the first inputs 81-3 and 81-4. Inside the forward and feedback paths (connections 10, 20), signals are transmitted through the first inputs 81-1 and 81-2**.

For further explanations, control signals $PF_i$, $PB_i$, M1 and M2 are substituted according to definition (2) to control signals $C_1$=M1 and $PF_i$ for gate 80-1, $C_2$=M1 and $PB_i$ for gate 80-2, $C_3$=M2 and $PF_i$ for gate 80-3 and $C_4$=M2 and $PB_i$ for gate 80-4. Control signals $C_1$ to $C_4$ can be supplied to cells 40 instead of M and $P_i$. The signals at the "i-connections" (input side) and at the "(i+1)/(i−1)-connections" (output side) of cell 40 are given in table 2. Equations (6) to (9) describe the logical relation between the connections of cell 40.

TABLE 2

Operation of cells 40

| input side, index i | | output side, index i+1 and i−1 | | |
|---|---|---|---|---|
| signals | at | signals | | at |
| | | propagation path | | |
| $A_i$ | 30-i | $A_{i+1}=A_i/z$ xor $(R_{i+1}$ and $C_3)$ xor $(L_i$ and $C_4)$ | (6) | 30-(i+1) |
| | | (6) for $C_1$="0", $C_2$="0": $A_{i+1}=A_i/z$ xor $(R_i$ and $C_3)$ xor $(L_i$ and $C_4)$ | (7) | |
| | | (6) for $C_3$="0", $C_4$="0": $A_{i+1}=A_i/z$ | (8) | |
| | | feedforward path | | |
| $R_i$ | 10-i | $R_{i+1} = (A_i/z$ and $C_1)$ xor $R_i$ | (9) | 10-(i−1) |
| | | feedback path | | |
| $L_i$ | 20-i | $L_{i-1} = (A_i/z$ and $C_2)$ xor $L_i$ | (10) | 20-(i+1) |

Equation (6) describes the signal propagation from at least a first cell 40-1 to a second cell 40-(i+1). Equation (6) can be implemented by, for example, logic arrangement 45 of FIG. 4 having (cf. FIG. 5) at least a first xor-gate (e.g., xor-gate 76 of gate 80-3) and a second xor-gate (e.g., xor-gate 76 of gate 80-4), a first and-gate (e.g., and-gate 75 of gate 80-3) and a second and-gate (e.g., and-gate 75 of gate 80-4). Equation (6) can be rewritten without departing from the scope of the present invention, as for example to:

$$A_{i+1}=A_i/z \text{ xor } ((C_4 \text{ and } L_i) \text{ xor } (C_3 \text{ and } R_{i+1})) \quad (11)$$

An implementation example of (11) is illustrated in FIG. 8. Based on the description herein, a person of skill in the art can use Boolean algebra to implement equation (6) by other means and, eventually, with additional logic (e.g., nand, nor, or or-gates, inverters) or other components (such as e.g., multiplexers). The present invention is intended to include such alternatives. In the propagation connection, only two xor-gates (in connections 30-i, 30*-i, 30**-i, 30-(i+1)) are required between stage 65-i of cell 40-i and stage 65i+1 of the next cell 40-(i+1).

As in equation (7), which is a simplification of (6) for TYPE-2-MODE operation, the propagation path (signal $A_i$) can be modified from both the feedback path (e.g., signal $L_i$) and from the forward path (e.g., signal $R_i$). For TYPE-1-MODE operation, the propagation path is preferably, not modified (equation (8)).

FIG. 6 shows simplified block diagrams of cells 40 configured for operating the LFSR 300 in the TYPE-1-MODE. Cells 40 are distinguished by their configurations #10, #11, #12 and #13. For convenience, connections 10, 20, and 30 (as in FIGS. 3–4) and stage 65 are given. Gates 80 operating according to equation (5) are symbolized as a conductors. Gates 80 operating according to equation (4) are shown by an xor-symbol ("+" in a circle).

For example, and not intended to be limiting, table 3 gives possible states (e.g., "1", "0") for PF and PB and configurations for cell 40 which are determined by PF and PB. Also, the operation of gates 80-1 to 80-4 is given by the terms 'xor' (equation (4)) and 'equal' (equation (5), conductor). Control signal M is assumed to be at, e.g., logical "1".

TABLE 3

Cell-configurations for TYPE-1-MODE

| configuration | #10 | #11 | #12 | #13 |
| --- | --- | --- | --- | --- |
| PF | "0" | "1" | "0" | "1" |
| PB | "0" | "0" | "1" | "1" |
| gate 80-1 | equal | xor | equal | xor |
| gate 80-2 | equal | equal | xor | xor |
| gate 80-3 | equal | equal | equal | equal |
| gate 80-4 | equal | equal | equal | equal |

In configuration #11, the forward path is modified and the feedback path is not modified. In configurations #12, the feedback path is modified and the forward path is not modified. In configuration #13 both forward and feedback paths are modified. In other words, active gates 80 located in the forward or feedback paths modify them, wherein passive gates 80 pass signals unchanged.

FIG. 7 shows simplified block diagrams of cells 40 configured for operating LFSR 300 in the TYPE-2-MODE. Cells 40 are distinguished by their configurations #20, #21, #22 and #23. Gates 80 operating according to equation (5) are symbolized as a conductor and therefore not specially numbered. Gates 80 operating according to equation (4) are shown by an xor-symbol ("+" in a circle).

For example, and not intended to be limiting, table 4 gives possible states (e.g., "1", "0") for PF and PB and configurations for cell 40 which are determined by PF and PB. Also, the operation of gates 80-1 to 80-4 is given by the terms 'xor' (equation (4)) and 'equal' (equation (5)). Control signal M is assumed to be at e.g., logical "0".

TABLE 4

Cell-configurations for TYPE-2-MODE

| configuration | #20 | #21 | #22 | #23 |
| --- | --- | --- | --- | --- |
| PF | "0" | "1" | "0" | "1" |
| PB | "0" | "0" | "1" | "1" |
| gate 80-1 | equal | equal | equal | equal |
| gate 80-2 | equal | equal | equal | equal |
| gate 80-3 | equal | xor | equal | xor |
| gate 80-4 | equal | equal | xor | xor |

In configuration #21, the propagation path is modified by signals coming from the unmodified forward path. In configuration #22, the propagation path is modified by signals coming from the unmodified feedback path. In configuration #23, the propagation connection is modified from both forward and feedback paths. In other words, when gates 80 located in the propagation paths are active, then signals are modified, wherein passive gates 80 pass signals unchanged.

The cell configurations of FIGS. 6–7 are not limited to four configurations in each mode. With a number of four gates 80 each being either active or passive, a number of 16 different configurations is possible. As it will be shown later, the gates in cell 40 can be arranged in a different way, so that more configurations can be added.

The function of LFSR 300 is now explained by way of examples. LFSR 300 can behave as prior art TYPE 1 LFSR 100 of FIG. 1. In that case LFSR 300 has three cells 40-1, 40-2, and 40-3 (m=3) corresponding to stages 111, 112, and 113 of FIG. 1. Xor-gate 70 (FIG. 3) corresponds to xor-gate 115 of FIG. 1, and stage 65-n (FIG. 3 for n=4) corresponds to stage 114. Control signals M1 and M2 are at logical "1" and "0", respectively, to set the first mode (TYPE-1-MODE). Control signals PB are $PB_3$="1", and $PB_1$=$PB_2$= "0". The other control signals $PF_{1,2,3}$ are at logical "0". With this control signals, cells 40-1 and 40-2 are configured as cell 40#10. Cell 40-3 has configuration #12. Active gate 80-2 in cell 40-3 corresponds to xor-gate 116 in FIG. 1. The resulting LFSR 300 is therefore structural and functional similar to LFSR 100. Feedback signal T1 (cf. FIG. 1) from a modified feedback connection (cell 40-3) goes through unmodified feedback connections of cells 40-1 and 40-2 to xor-gate 70.

Figure 2:
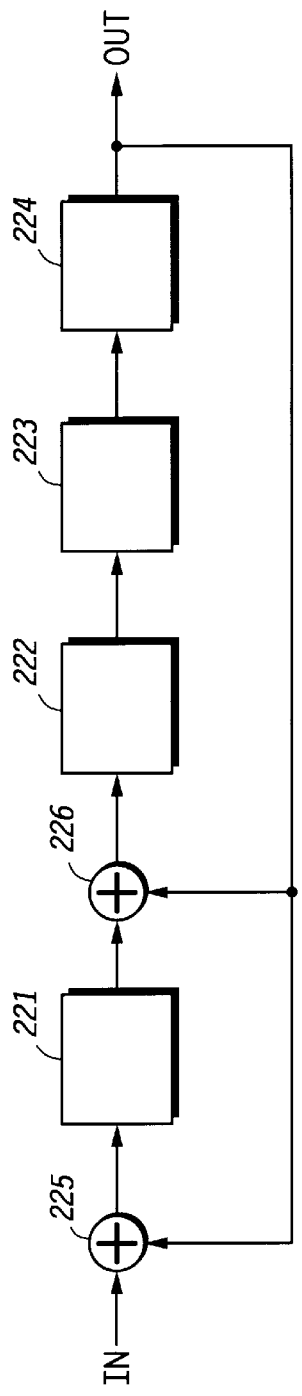
FIG. 2 shows a simplified block diagram of a prior art LFSR of TYPE 2.

Now, LFSR 300 can be switched to TYPE 2 LFSR 200 of FIG. 2. Four cells 40-1, 40-2, 40-3, and 40-4 (n=4) correspond to stages 221, 222, 223, 224 of FIG. 2. Xor-gate 70 (FIG. 3) corresponds to xor-gate 225 of FIG. 2. Control signals M1="0" and M2="1" set second mode TYPE-2-MODE. Control signals are $PB_1$="1" and $PB_{2,3,4}$="0"and $PF_{1,2,3,4}$="0". Cells 40-2, 40-3 and 40-4 have the configuration #20. Cell 40-1 has active gate 80-4 which results in configuration #22. The resulting LFSR 300 is structural and functional similar to LFSR 200.

In general, gates 80-k of cells 40-i (i=1 to m) can be classified into a first set (index k=1), a second set (k=2), a third set (k=3 and k=4) of gates. When LSFR 300 operates in TYPE-1-MODE, the first set provides data propagation in the first direction (feeding forward) and the second set provides data propagation in the second direction (feedback). The stages of the third set propagate in the first direction. The stages of the first and second set can be activated simultaneously. This features allows, for example, to process data by polynom multiplication and polynom division at the same time.

When LFSR 300 operates in the second mode, the stages of the first and second sets provide data propagation in the first and second directions only through inputs 81, but not through inputs 82. The stages of the third set propagate data in the first direction.

LFSR 300 of the present invention can generally be described as a signal processing apparatus which has a first path (e.g., connections 30) for propagating a first path signal A (e.g., $A_i$, $A_{i+1}$) with signals $A_{k1}$, $A_{k2}$, $A_{k3}$ (k1<k2<k3, e.g., k1=1, k2=2, k3=3) in a first direction, a second path (e.g., connections 10) for propagating a second path signal $R_k$ (e.g., $R_i$, $R_{i+1}$) in the first direction and a third path (e.g., connections 20) for propagating a third path signal $L_k$ (e.g., $L_i$, $L_{i-1}$) in a second, opposite, direction. LFSR 300 at least comprises means (e.g., bus 50) for receiving first control signal $C^*_1$ (e.g., M1 and $PF_1$), second control signal $C^*_2$ (e.g., M1 and $PB_3$), third control signal $C^*_3$ (e.g., M2 and $PF_2$) and fourth control signal $C^*_4$ (e.g., M2 and $PB_2$).

The first path has at least a first stage (e.g., stage 65 of cell 40-1), a second stage (e.g., stage 65 of cell 40-2), and a third stage (e.g., stage 65 of cell 40-3). The first stage provides signal $A_{k1}$ (e.g., $A_1^*$) to the second stage. The second stage provides signal $A_{k2}$ (e.g., $A_2^*$) to the third stage, and the third stage provides signal $A_{k3}$ (e.g., $A_3^*$). A first logic arrangement (e.g., gates 80-3 and 80-4 of cell 40-2) modifies signal $A_{k2}$ to $A_{k2+1} = A_{k2}$ xor (R and $C^*_3$) xor (L and $C^*_4$) (cf. 7). The second path has at least a second logic arrangement (e.g., gate 80-1 of cell 40-1) which receives signal $A_{k1}$ (e.g., an input signal at terminal 11) and modifies $R_{k1}$ to $R_{k1+1} = (A_{k1}$ and $C^*_1$) xor $R_{k1}$ (cf. 9). The third path has at least a third logic arrangement (e.g., gate 80-2 of cell 40-3) which receives component $A_{k3}$ and modifying $L_k$ to $L_{k3-1} = (A_{k3}$ and $C^*_2$) xor $L_{k3}$ (cf. 10). Depending on $C^*_1$, $C^*_2$ and on $C^*_3$, $C^*_4$, first, second and third stages and first, second, and third logic arrangements operate either in a first mode as a TYPE-1 LFSR and in a second mode as a type TYPE-2 LFSR, wherein in both modes the polynomial characteristics are determined by $C^*_1$, $C^*_2$ and by $C^*_3$, $C^*_4$.

A method for signal processing in a serial arrangement of cells k0 =1 to m (e.g., cells 40-1 to 40-40) with at least a first cell k1 (e.g., 40-10), a second cell k2 (e.g., 40-20), and a third cell k3 (e.g., 40-30), with k2≧k1+1, k3≧k2+1, (e.g., k1=10, k2=20, k3=30) has the following steps:

(i) providing a first control signal $C^*_1$ (e.g., $C_1$ to cell 40-10), a second control signal $C^*_2$ (e.g., $C_2$ to cell 40-30), a third control signal $C^*_3$ (e.g., $C_3$ to 40-20) and fourth control signal $C^*_4$ (e.g., $C_4$ to 40-30);

(ii) propagating a first path signal A in a first path (e.g., connections 30) through the cells k1, k2 and k3 in a first direction;

(iii) propagating a second path signal R in a second path (e.g., connections 10) through the cells k1 and k2 in the first direction;

(iv) propagating a third path signal L in a third path (e.g., connections 20) through the cells k2 and k3 in a second, opposite direction.

During propagation of path signals A, R, L

| cell | k1 | receives components | $A_{k1}$<br>$R_{k1}$ | provides components | $A_{k1+1}$<br>$R_{k1+1}$ |
|---|---|---|---|---|---|
| | k2 | | $A_{k2}$<br>$R_{k2}$<br>$L_{k2}$ | | $A_{k2+1}$<br>$R_{k2+2}$<br>$L_{k2-1}$ |
| | k3 | | $A_{k3}$<br>$L_{k3}$ | | $L_{k3-1}$ |

When R is propagated, cell k1 modifies $R_{k1}$ to $R_{k1+1} = (A_{k1}/z$ and $C^*_1$) xor $R_{k1}$ (equation (9) with i=k1). $R_{k1}$ is further propagated to $R_{k2}$ (e.g., through cell 40-11 to 40-19).

When A is propagated, cell k2 modifies $A_{k2}$ to $A_{k2+1} = A_{k2}/z$ xor ($R_{k2+1}$ and $C^*_3$) xor ($L_{k2}$ and $C^*_4$) (equation (6) with i=k2). $A_{k2+1}$ is further propagated to $A_{k3}$ by e.g., cells 40-21 to 40-29. When L is propagated, cell k3 modifies $L_{k3}$ to $L_{k3-1} = (A_{k3}/z$ and $C^*_2$) xor $L_{k3}$ (equation (10)). $L_{k3-1}$ is further propagated to $L_{k2}$ by e.g., cells 40-29 to 40-21. Output signals can selectively derived from any of the cells.

Path signals R and L can be propagated substantially simultaneously. For control signals $C^*_3 = C^*_4 = $ "0", a first sequence of an arrangement defined by cells k2 and k3 operates as a TYPE 2 LFSR. For control signals $C^*_1 = C^*_2 = $ "0", the first sequence operates as a TYPE 1 LFSR. A first sequence of cells can thereby operate as a TYPE 1 LFSR and a second sequence can thereby operate as a TYPE 2 LFSR.

It is possible to change any control signal during the propagation of path A, R and L. Thereby, the polynomial characteristics can be changed, for example, depending on an output signal. For example, (a) during propagating path signals A and R, an input signal sequence present at stage k1 is multiplied by a first characteristic polynomial function to an output signal sequence present at stage k3, and (b) during propagating path signals A and L, an input signal sequence present at stage k1 is divided by a second characteristic polynomial function to an output signal sequence present at stage k3.

FIG. 8 shows a logic arrangement 45' (dashed frame) implemented according to equation (10) as it can also be used in cell 40. Analogies of inputs in FIGS. 8 and 4 are: 81-3' to 81-3 (connection **30\*-i), 82-4' to 82-4 (connection 20-i), 82-3' to 82-3 (connection 10-i), 84-3 and 83-3 combined to 87', 84-4 and 83-4 combined to 87". Outputs 86-4 and 86-4' are corresponding. Preferably, logic arrangement 45' comprises xor-gate 76', xor-gate76", and-gate 75" and and-gate 75". And-gate 75' with inputs 87' and 82-3' has output 85' coupled to input 87' of xor-gate 76'. And-gate 75" with inputs 87" and 82-4' has output 85" coupled to input 87" of xor-gate 76'. Xor-gate 7 6' has output 89' coupled to input 88' of xor-gate 76". Also, xor-gate 76" has input 81-3' and output 86-4'. And-gate 75' receives R and $C_3$ and provides (R and $C_3$). And-gate 75" receives $C_4$ and L and provides (L and $C_4$). Xor-gate 76' receives (R and $C_3$) and (L and $C_4$) and provides ((R and $C_3$) xor (L and $C_4$)). Xor-gate 76"** receives A* and ((R and $C_3$) xor (L and $C_4$)) and provides A**=A* xor (($C_3$ and R) xor ($C_4$ and L)).

A particular feature of the present invention is the it makes it possible to provide a LFSR having, at the same time, at least a first sequence operating in TYPE-1-MODE and a second sequence operating in TYPE-2-MODE. Also, the polynom degree can be programmed. For example, and not intended to be limiting, a LFSR can comprise cells 40-1, 40-2, 40-3 configured as 40#21, 40#22, 40#20 and 40#12, respectively (cf. FIGS. 6–7). In that example, cells 40-1 and 40-2 form the first sequence (TYPE 2) and cell 40-4 forms the second sequence (TYPE 1).

Although LFSR 300 of FIG. 3 receives a data signal at an input terminal (e.g., terminals 31, 11), the present invention is not limited to such LFSRs. The apparatus and method of the present invention are also applicable for other applications without input, such as for random sequence generators, known by persons of skill in the art.

While the extraction of an output signal has been illustrated at connection 30-n, persons of skill in the art will understand based on the description herein, that an output signal can be obtained at any connection 30-i, 10-i, or 20-i or combination thereof. Processed data can also be obtained from two or more connections 30-i, 10-i or 20-i. Further, persons of skill in the art are able to include inverters or use inverse or other logical states without departing from the scope of the present invention.

The LFSR of the present invention can also be used to calculate data by input-output function having more than n polynomials. Polynomial vectors longer than m can be divided into smaller subvectors. The calculation can be stepwise, as for example by: supplying input data, using a first subvector to calculate an intermediate result, storing the intermediate result, supplying the intermediate result and using a second subvector to obtain a final result.

LFSR 300 of the present invention is very useful, for example, in a digital signal processor (DSP). Once the polynom vector and the mode signal is obtained from e.g., a core of the DSP, LFSR 300 operates independently, thus saving core resources. Data signals can be fed forward and back simultaneously, what is needed e.g., in the algorithms for the GSM cellular phone standard. A person of skill in the art can simplify LFSR 300 according to the needs of the application to further reduce costs by leaving out idle elements. When some characteristic polynomials are not applicable, than some of the gates can be left out. The invented arrangement can also be used to operate a first cell sequence in the first mode (TYPE 1) and another cell sequence in the second mode (TYPE 2). The present invention has the further advantage by virtue of its programmability of reducing the total amount of logic gates (and therfore chip are) required to implement multiple algorithm.

We claim:

1. A signal processing apparatus comprising:

a first path for propagating a first path signal A having components $A_{k1}$, $A_{k2}$, $A_{k3}$ in a first direction;

a second path for propagating a second path signal R having components $R_{k1}$, $R_{k1+1}$ in the first direction;

a third path for propagating a third path signal L having components $L_{k3}$, $L_{k3-1}$ in a second, opposite, direction;

means for receiving first control signal $C^*_1$, second control signal $C^*_2$, third control signal $C^*_3$ and fourth control signal $C^*_4$ for modifying the characteristic of one or more of the first, second, and third paths;

in the first path, at least a first stage, a second stage, and a third stage, said first stage providing component $A_{k1}$ to said second stage, said second stage providing component $A_{k2}$ to said third stage, said third stage providing component $A_{k3}$, a first logic arrangement modifying said component $A_{k2}$ to $A_{k2+1}=A_{k2}$ xor (R and $C^*_3$) xor (L and $C^*_4$);

in the second path, at least a second logic arrangement receiving component $A_{k1}$ and modifying $R_{k1}$ to $R_{k1+1}=(A_{k1}$ and $C^*_1)$ xor $R_{k1}$; and in the third path, at least a third logic arrangement receiving component $A_{k3}$ and modifying $L_{k3}$ to $L_{k3-1}=(A_{i3}$ and $C^*_2)$ xor $L_{k3}$; wherein said control signals thereby activate said first and second stages to selectively operate as part of a TYPE 1 linear feedback shift register or of a TYPE 2 linear feedback shift register or both.

2. The apparatus of claim 1, wherein said first logic arrangement comprises at least a first xor-gate, a second xor-gate, a first and-gate and a second and-gate, said first and-gate receiving R and $C_3$ and providing (R and $C_3$), said first xor-gate receiving $A_i^*$ and (R and $C_3$) and providing ($A^*$ xor (R and $C_3$)), said second and-gate receiving $C_4$ and L and providing (L and $C_4$), said second xor-gate receiving ($A^*$ xor (R and $C_3$)) and (L and $C_4$) and providing $A^{**}=A^*$ xor (R and $C_3$) xor (L and $C_4$).

3. The apparatus of claim 1, wherein said first logic arrangement comprises at least a least a first xor-gate, a second xor-gate, a first and-gate and a second and-gate, said first and-gate receiving R and $C_3$ and providing (R and $C_3$), said second and-gate receiving $C_4$ and L and providing (L and $C_4$), said first xor-gate receiving (R and $C_3$) and (L and $C_4$) and providing ((R and $C_3$) xor (L and $C_4$)), said second xor-gate receiving $A^*$ and ((R and $C_3$) xor (L and $C_4$)) and providing $A^{**}=A^*$ xor (($C_3$ and R) xor ($C_4$ and L)).

4. The apparatus of claim 1 wherein said first, second, and third path signals are propagated in said first, second and third paths, respectively, substantially simultaneously.

5. The apparatus of claim 1 wherein said first path is selectively influenced by said first path signal R, and by said second path signal L.

6. A method for processing signals by a serial arrangement of cells $k0=1$ to m with at least a first cell k1, a second cell k2, and a third cell k3, with $k2 \geq k1+1$, $k3 \geq k2+1$, the method comprising the steps of:

providing a first control signal $C^*_1$ to said first cell k1, a second control signal $C^*_2$ to said third cell k3, a third control signal $C^*_3$ to said second cell k2 and fourth control signal $C^*_4$ to said third cell k3 for modifying the characteristic of said first, second, and third cells;

propagating a first path signal A in a first path through the cells k1, k2 and k3 in a first direction;

propagating a second path signal R in a second path through the cells k1 and k2 in said first direction, propagating a third path signal L in a third path through the cells k2 and k3 in a second, opposite, direction.

7. The method of claim 6 wherein in said steps of propagating path signals A, R, L, cell k1 receives components $A_{k1}$ and $R_{k1}$ and provides components $A_{k1+1}$ and $R_{k1+1}$; cell k2 receives components $A_{k2}$ and $R_{k2}$ and $L_{k2}$ and provides components $A_{k2+1}$ and $R_{k2+1}$ and $L_{k2-1}$ and cell k3 receives components $A_{k3}$ and $L_{k3}$ and provides component $L_{k3-1}$, wherein in the step of propagating R, cell k1 modifies $R_{k1}$ to $R_{k1+1}=(A_{k1}/z$ and $C^*_1)$ xor $R_{k1}$, which is further propagated to $R_{k2}$;

wherein in the step of propagating A, cell k2 modifies $A_{k2}$ to $A_{k2+1}=A_{k2}/z$ xor ($R_{k2}$ and $C^*_3$) xor ($L_{k2}$ and $C^*_4$) which is further propagated to $A_{k3}$; and wherein in the step of propagating L, cell k3 modifies Lk3 to $L_{k3-1}=(A_{k3}/z$ and $C^*_2)$ xor $L_{k3}$ which is further propagated to $L_{k2}$, output signals being selectively derived from any of the cells.

8. The method of claim 6 wherein said steps of propagating a second path signal R and propagating a third path signal L are performed substantially simultaneously.

9. The method of claim 6 wherein under the condition that third and fourth control signals $C^*_3$ and $C_4$ are $C^*_3=C^*_4=$"0", a first sequence of an arrangement defined by cells k2 and k3 operates as a TYPE 2 LFSR and wherein under the condition that first and second control signals $C^*_1$ and $C^*_2$ are $C^*_1=C^*_2=$"0", said first sequence operates as a TYPE 1 LFSR.

10. The method of claim 6 wherein a first sequence of cells operates as a TYPE 1 LFSR and a second sequence of cells operates as a TYPE 2 LFSR.

11. The method of claim 6 wherein during said steps of propagating said first path signal A and propagating said second path signal R, an input signal sequence present at stage k1 is multiplied by a first characteristic polynomial function to an output signal sequence present at stage k3.

12. The method of claim 6 wherein during said steps of propagating said first path signal A and propagating said third path signal L, an input signal sequence present at stage k1 is divided by a second characteristic polynomial function to an output signal sequence present at stage k3.

* * * * *